(12) United States Patent
Altaii et al.

(10) Patent No.: US 7,692,091 B2
(45) Date of Patent: Apr. 6, 2010

(54) SHAPE MEMORY ALLOY MOTOR AS INCORPORATED INTO SOLAR TRACKING MECHANISM

(76) Inventors: Karim Altaii, 845 Sugar Maple La., Harrisonburg, VA (US) 22801; Benjamin Thomas, 2738 Ridgeview Rd., Powhatan, VA (US) 23139

( * ) Notice: Subject to any disclaimer, the term of this patent is extended or adjusted under 35 U.S.C. 154(b) by 1080 days.

(21) Appl. No.: 11/236,695

(22) Filed: Sep. 27, 2005

(65) Prior Publication Data

US 2007/0074753 A1 Apr. 5, 2007

(51) Int. Cl.
*H01L 31/00* (2006.01)
(52) U.S. Cl. ............. 136/246; 250/203.4; 126/577
(58) Field of Classification Search ............. 136/246; 250/203.4; 126/573–582
See application file for complete search history.

(56) References Cited

U.S. PATENT DOCUMENTS

| | | | | |
|---|---|---|---|---|
| 3,725,835 A | * | 4/1973 | Hopkins et al. | 337/140 |
| 4,154,221 A | * | 5/1979 | Nelson | 126/573 |
| 4,297,521 A | * | 10/1981 | Johnson | 136/248 |
| 4,424,802 A | * | 1/1984 | Winders | 126/575 |
| 4,628,142 A | * | 12/1986 | Hashizume | 136/246 |
| 4,811,564 A | * | 3/1989 | Palmer | 60/527 |
| 5,169,456 A | * | 12/1992 | Johnson | 136/246 |

FOREIGN PATENT DOCUMENTS

JP 60-073252 * 4/1985

* cited by examiner

*Primary Examiner*—Jeffrey T Barton
(74) *Attorney, Agent, or Firm*—IPCL Group PLC; Anthony Tacconi, Esq.

(57) ABSTRACT

The present invention provides a motor driven by shape memory alloys for use in a variety of applications. In the disclosed embodiment, the motor is used to drive a photovoltaic panel so that the panel may remain in appropriate alignment with the sun throughout the day. In such a configuration, the motor assembly relies upon the intrinsic properties of shape memory alloys, in conjunction with a spring assembly, in order to generate sufficient torque in order to rotate the photovoltaic panel. In order to control the orientation of the panel, the system relies upon a sun tracking mechanism which includes an analog sensor circuit, a plurality of phototransistors and a power source. Accordingly, the device is able to rotate the photovoltaic panel in discrete and precise increments as the day progresses.

9 Claims, 7 Drawing Sheets

SHAPE MEMORY ALLOY MOTOR AS INCORPORATED INTO SOLAR TRACKING MECHANISM

FIELD OF THE INVENTION AND RELATED ART

This invention relates to motor assemblies incorporating shape memory alloys in order to drive various devices, more specifically, shape memory alloy motors to be used in solar tracking devices.

In a conventional solar tracking system, step motors are often used to drive the motion of solar collectors. There exist other, more passive, methods, such as the heating of fluids to shift the center of gravity of a rotating mount. These techniques can be bulky, heavy, expensive, or unreliable, and may use a substantial amount of power. The energy output of a tracking photovoltaic cell is greater than that of a stationary one by about 30%. Traditional solar tracking systems can, however, increase the cost of the purchase and installation by much more than 30%. If this is the case, then it becomes less expensive to invest in additional stationary photovoltaic capacity. For example, one might be comparing the cost between 10 solar tracking collectors versus 13 stationary ones. When considering the space required by a photovoltaic installation, as well as the hazardous and expensive chemical processes of photovoltaic fabrication, it is clear that maximizing the output of each cell through solar tracking can be a better environmental and economic alternative to the manufacture and purchase of additional capacity.

Solar tracking, in particular solar tracking involving the use of shape memory alloys, is not a novel concept in the relevant art. For example, U.S. Pat. No. 4,628,142 (Hashizume) discloses a solar tracking mechanism that, although utilizing shape memory alloys, requires that the shape memory coils be mounted at the focal point of a plurality of parabolic concentrators. Nonetheless, the present invention discloses a more efficient and precise mechanism for solar tracking. In addition, unlike other devices, such as the Hashizume device, the shape memory alloy motor disclosed in the instant invention may be utilized in applications other than those deriving power from solar sources. Further, the instant invention has the capability of driving through arbitrarily definable angles using precise, discrete steps.

SUMMARY AND OBJECTS OF THE INVENTION

The invention discloses a novel and efficient drive mechanism for use in a solar tracking device. This novel mechanism replaces traditional stepper motors or another analogous art with shape memory alloys. Shape memory alloys (SMAs), also known as smart materials, have the capability of altering their shape upon the application of heat or electrical current. SMA materials are particularly useful as they have the further capability of returning to their original pre-determined shape once the application of heat or electrical current is discontinued and the heat dissipates.

The use of SMAs as actuators reduces the size and cost of the drive mechanism while maintaining precision and efficiency. Accordingly, it is an object of the invention to present a drive mechanism incorporating SMAs that may be used in a variety of applications, under any circumstances, that require a precise and efficient drive mechanism. The invention further discloses a novel sun tracking apparatus, used in conjunction with the drive mechanism, which utilizes an analog sensor circuit with phototransistors, as sensors, to control the motion of the actuators.

DETAILED DESCRIPTION OF THE PREFERRED EMBODIMENT

The primary embodiment of the invention disclosed herein focuses on a single axis tracking system. That is, the system follows the sun in the azimuth (east to west) direction throughout the day, but does not have a second axis of motion to correct for the seasonally changing zenith (vertical) angle. This is because a middle value for the zenith angle can be chosen as the fixed angle of the tracker, maintaining a low margin of error throughout the year. In other words, the azimuth tracking substantially increases the energy output (by about 28%, depending mostly on the latitude of the site), while the zenith tracking would only provide a marginal improvement at twice the cost (an additional 4% or so). However, those skilled in the art will realize that the same design principles disclosed herein could be applied to a second axis of motion if desired.

Figure 1:
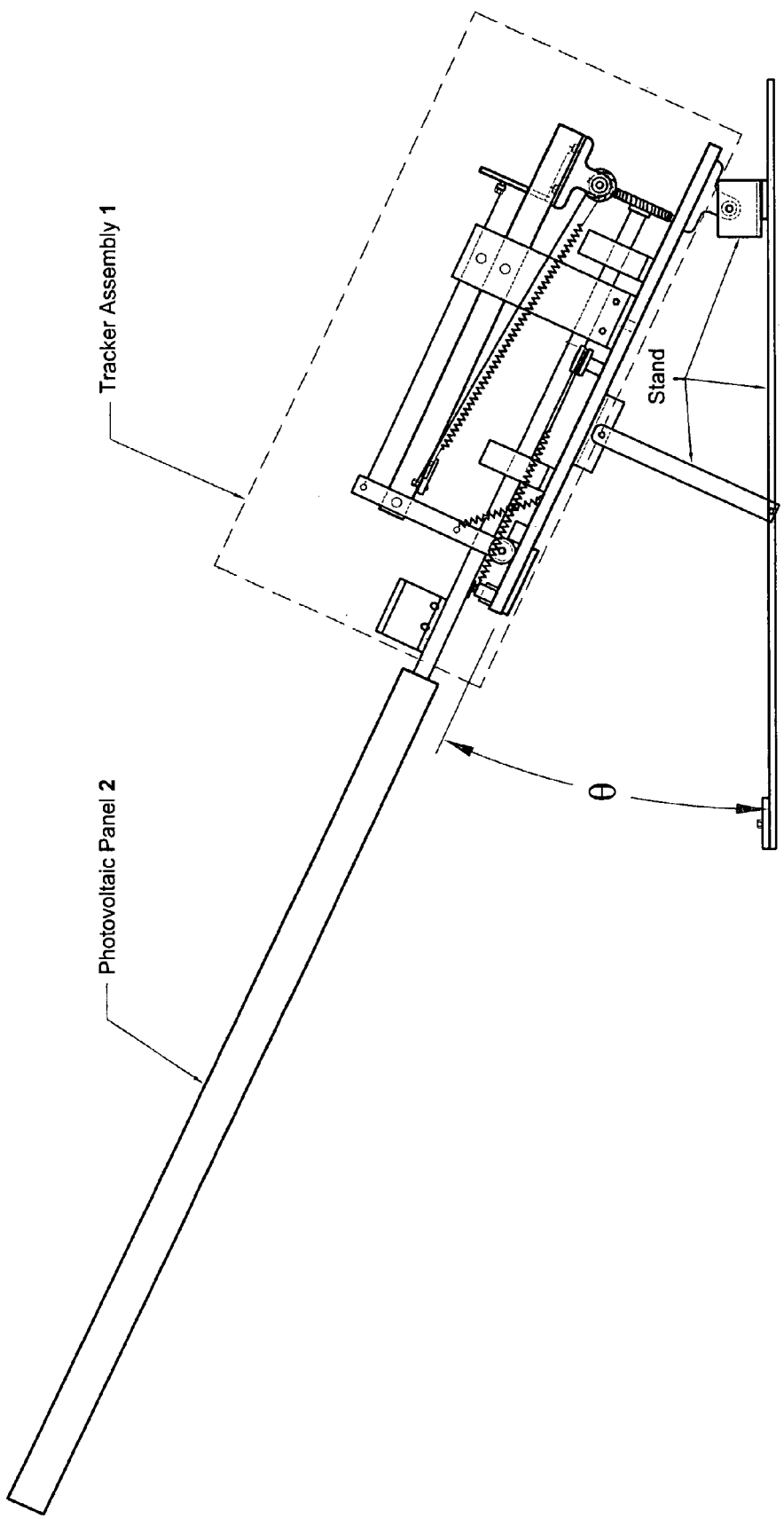
FIG. 1 is a side view of the tracker assembly with photovoltaic panel and stand.
Figure 2:
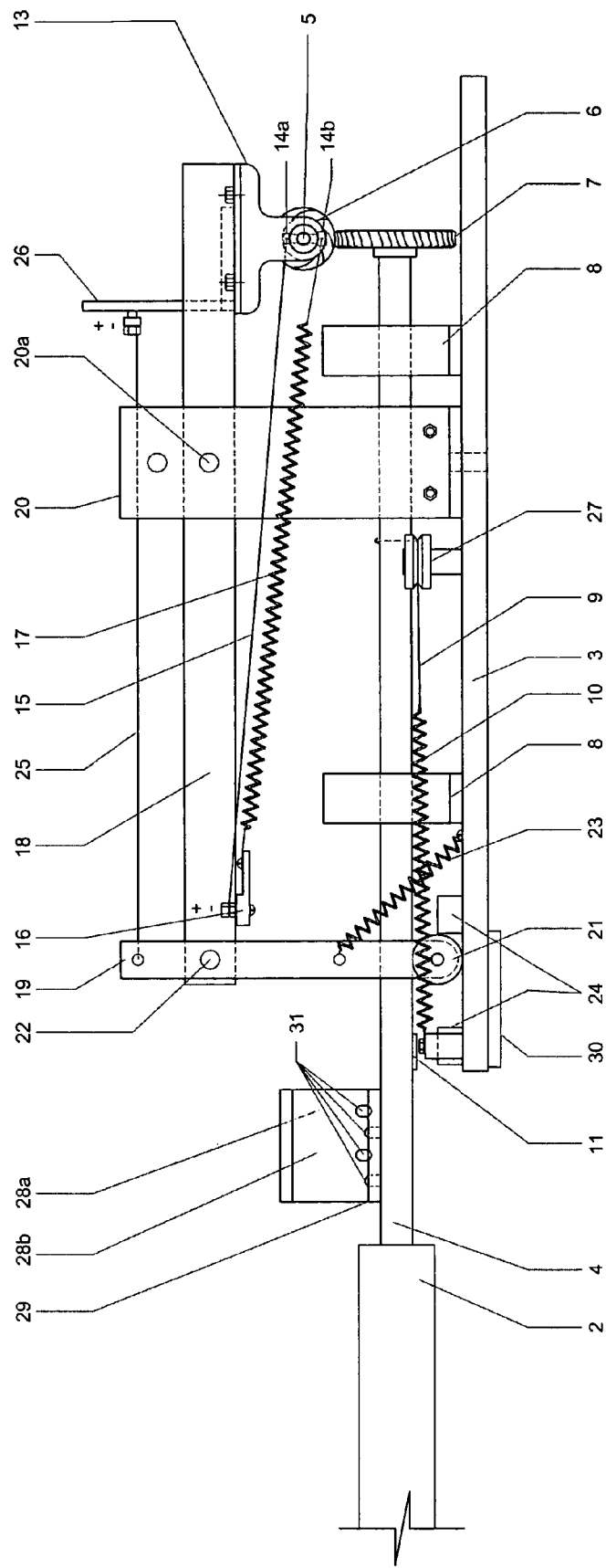
FIG. 2 is a side view of the tracker assembly.
Figure 3:
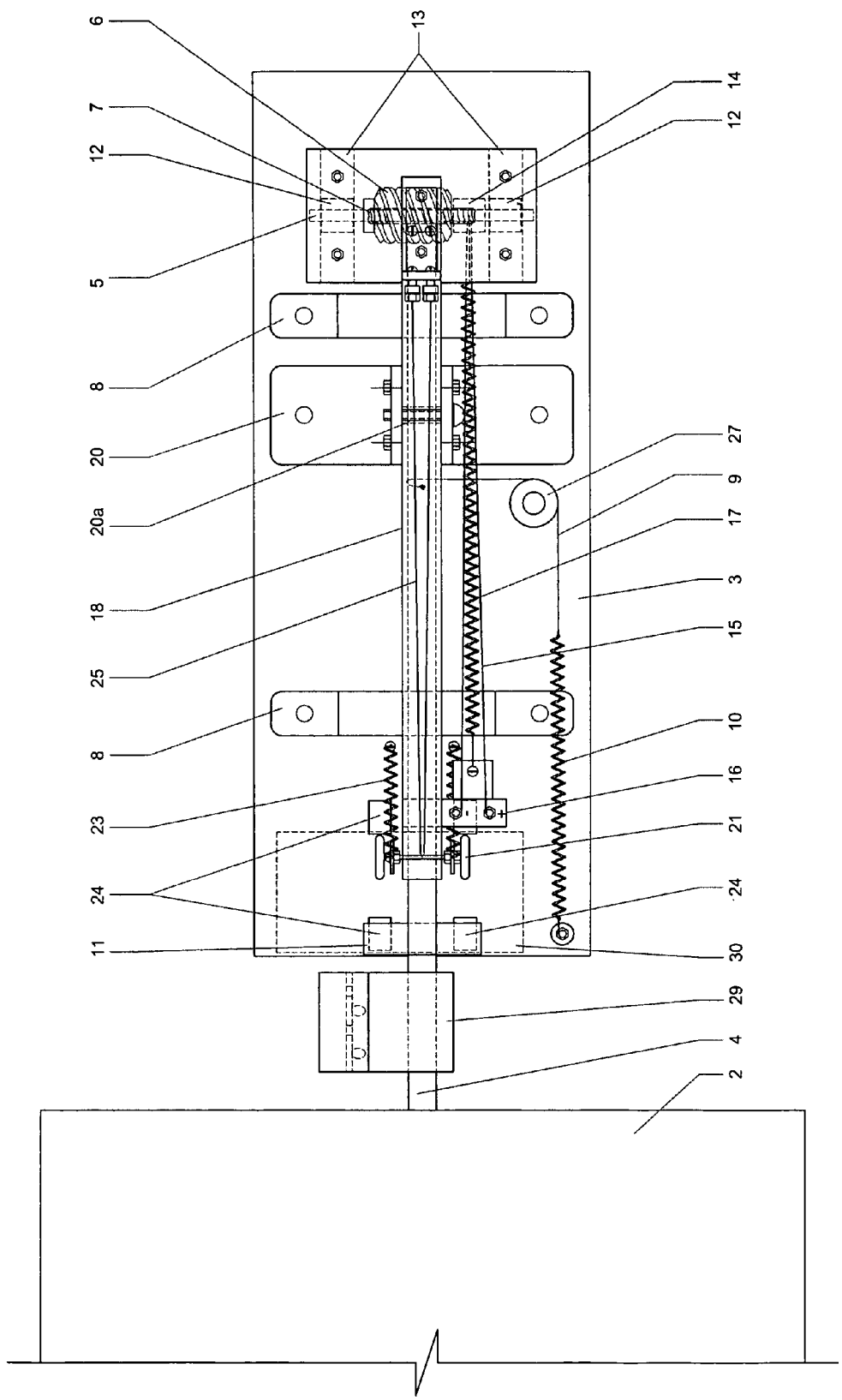
FIG. 3 is a front view of the tracker assembly.

Referring now to FIGS. 1, 2, and 3, the primary embodiment of the present invention is shown as a solar tracking device. In this embodiment, the device may be categorized as having three primary components: a photovoltaic panel 2, a tracking assembly 1, and a base platform 3. The photovoltaic panel 2 is disposed at the end of a rotatable output shaft 4, which in turn is driven in a forward motion by the forward motion drive assembly and in reverse by the disengagement assembly. The photovoltaic panel 2 and the tracking assembly, as a unit, are mounted on an adjustable stand that supports a base platform 3 that permits the adjustment and fixation of the zenith angle of the assembly.

Figure 4:
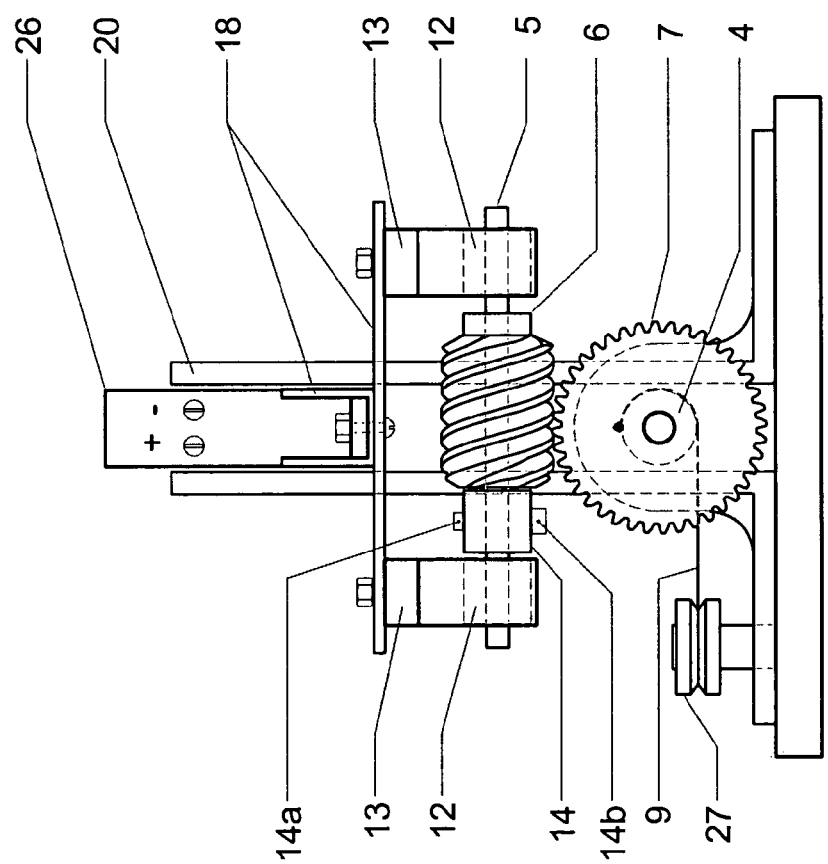
FIG. 4 is a partial bottom view of the tracker assembly showing the drive assembly.

The forward motion drive assembly shown in FIG. 4 includes a drive shaft 5 that engages an output shaft 4 through a coupled worm drive 6 and worm gear 7. The output shaft 4 is connected to the photovoltaic panel 2 and is supported by a pair of ball bearings 8 which support the weight of the output shaft 4 and the photovoltaic panel 2 while allowing the output shaft 4 to swivel. The output shaft 4 is engaged in two locations, namely, by the worm gear 7 mounted axially on the base of the shaft 4 and by a cable 9 attached to a return spring 10. An output shaft stopper 11 is also disposed on the output shaft 4 in order to prevent the output shaft 4, during return motion, from rotating beyond the predetermined start position.

The worm gear assembly is responsible for the movement of the output shaft 4 in the forward direction. In the northern hemisphere, a forward direction is from east to south to west. The worm gear assembly consists of the worm drive 6 and the worm gear 7. The worm drive 6 mounted on the drive shaft 5 engages the worm gear 7. The drive shaft 5 is supported by two unidirectional bearings termed backlash clutches 12. In the preferred embodiment, there is at least one such unidirectional bearing so as to prevent backlash while supporting the weight of the drive shaft 5. A second unidirectional bearing, known as the drive clutch 14, is also mounted on the drive shaft 5.

A forward actuator wire 15 is provided with one end of said wire attached to the drive clutch 14 at an attachment point 14a and the other end attached to a fixed mount, in this case the forward mounting plate 16. The forward actuator wire 15 is composed of a shape memory alloy (SMA). Although more than one type of SMA may be used, the most effective SMA in this embodiment would be a nickel titanium alloy. As will be appreciated by those skilled in the pertinent art, SMAs composed of other materials (e.g. copper zinc aluminum alloys) may be better suited for other applications, depending on the particular requirements of the application. The forward actuator wire 15 is positioned such that a contraction of the wire causes a rotation in the drive clutch 14. The forward actuator wire 15 is opposed by the forward spring 17 which is attached to a fixed mount 16 at one end and at attachment point 14b on the opposite end.

The entire forward motion drive assembly is mounted on one end of a rocking drive platform 18 which is pivotably connected to a locking arm 19. The drive platform 18 is further supported near its center by a platform pivot bracket 20. The platform pivot bracket having a portion defining a hole in which a platform pivot 20a is mounted.

The locking arm 19 is provided with locking arm rollers 21 in contact with the fixed base platform 3 which permit the locking arm 19, when not locked into place, to remove the lock and pivot the drive platform 18 around the platform pivot 20a. The Locking Arm 19 is pivotable about the arm pivot 22. The locking arm 19 is held by two symmetrical engagement springs 23 that generate a single force which performs multiple functions. The force generated by the springs 23 holds the locking arm rollers 21 down against the base platform 3 while forcing the gears 6 and 7 together by pulling the locking arm 19 into the locked position between the drive platform 18 and the base platform 3. Arm stoppers 24 are provided so as to limit the angle of rotation of the locking arm 19 in either direction. The drive platform 18 is pivotably connected to the platform pivot bracket 20 which supports the drive platform 18 while allowing movement around the platform pivot 20a when the gears 6, 7 are to be disengaged or re-engaged.

A disengagement actuator 25, composed of an SMA wire, is attached at one end to the drive platform 18, or a mounting plate 26 attached to said drive platform, and at the other to a point on the locking arm 19, such that a contraction of the disengagement actuator 25 would rotate the locking arm 19 and stretch the engagement springs 23 thereby disengaging the gears 6, 7. A return spring 10 is provided having one end attached to a point on the fixed base platform 3 and the other end attached to the return spring cable 9. The return spring cable 9 stretches from the return spring 10, through the return spring pulley 27, and is attached to the output shaft 4.

Figure 5:
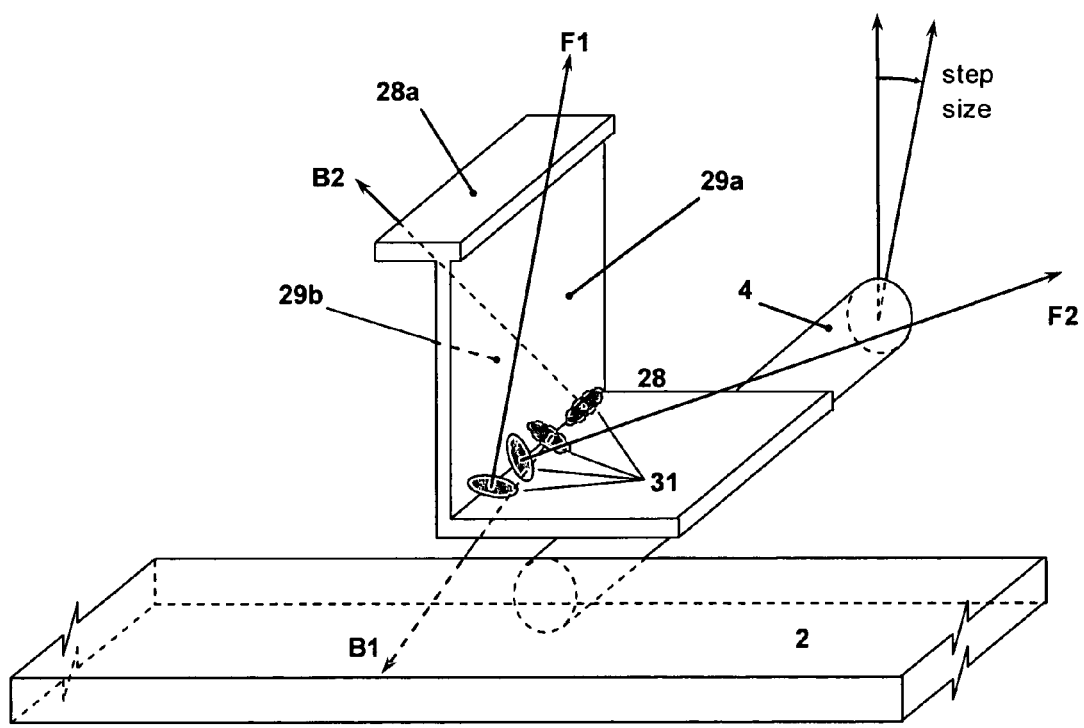
FIG. 5 is a perspective view of the sensor mount.
Figure 6:
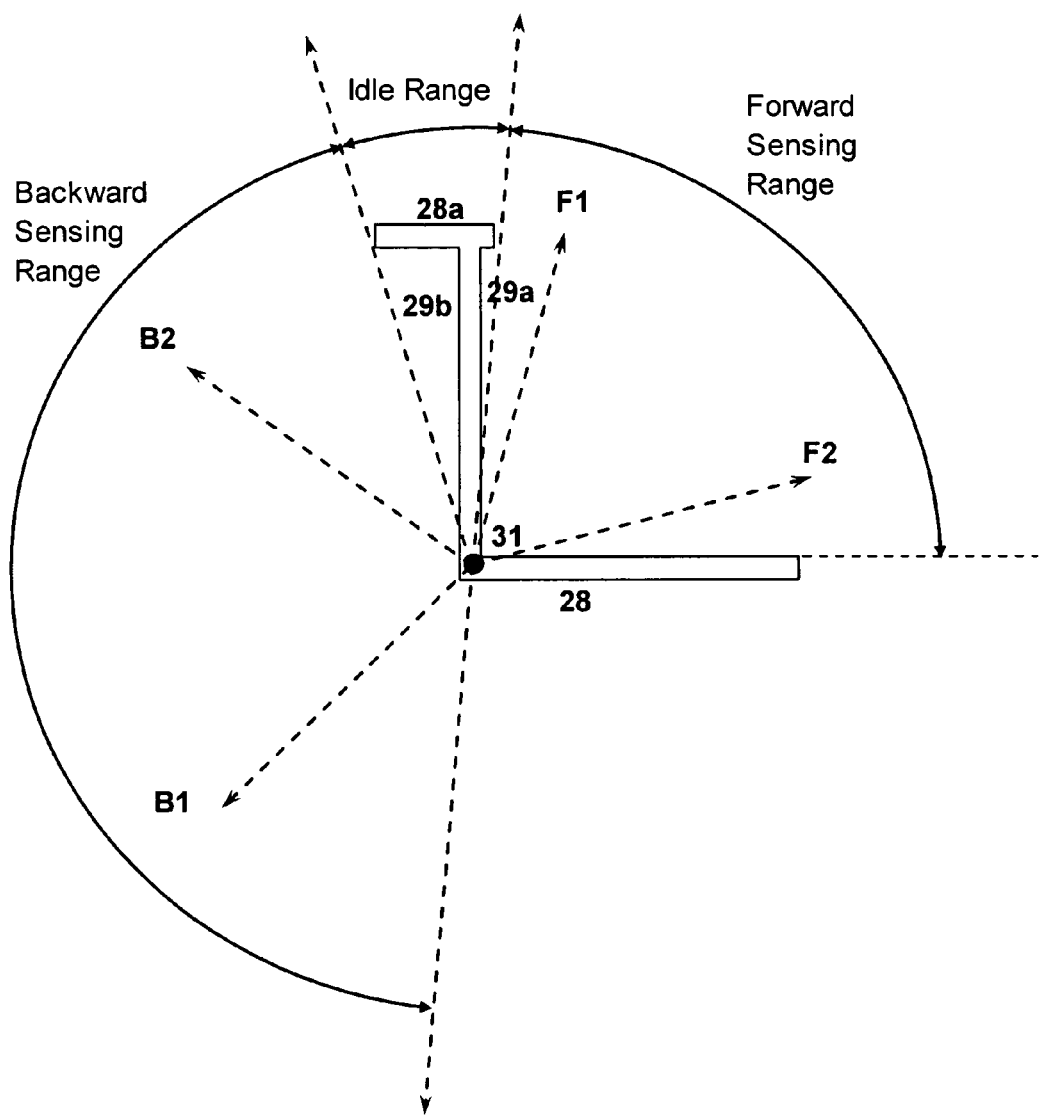
FIG. 6 is a top view of the sensor mount.

FIGS. 5 and 6 show the sensor mount 28 which consists of a shade 29a, 29b and an overhanging portion 28a. Two forward motion phototransistors, F1, F2, are mounted on one side, the forward side, of a shade 29a and two additional backward motion sensors, B1, B2 are secured on the other side, the backward side, of the shade 29b. These phototransistors are secured to a sensor mount 28 that is attached to the output shaft 4 so that it moves with the photovoltaic panel 2 throughout the day to follow the relative position of the sun. The sensor mount 28 includes an overhang portion 28a.

Figure 7:
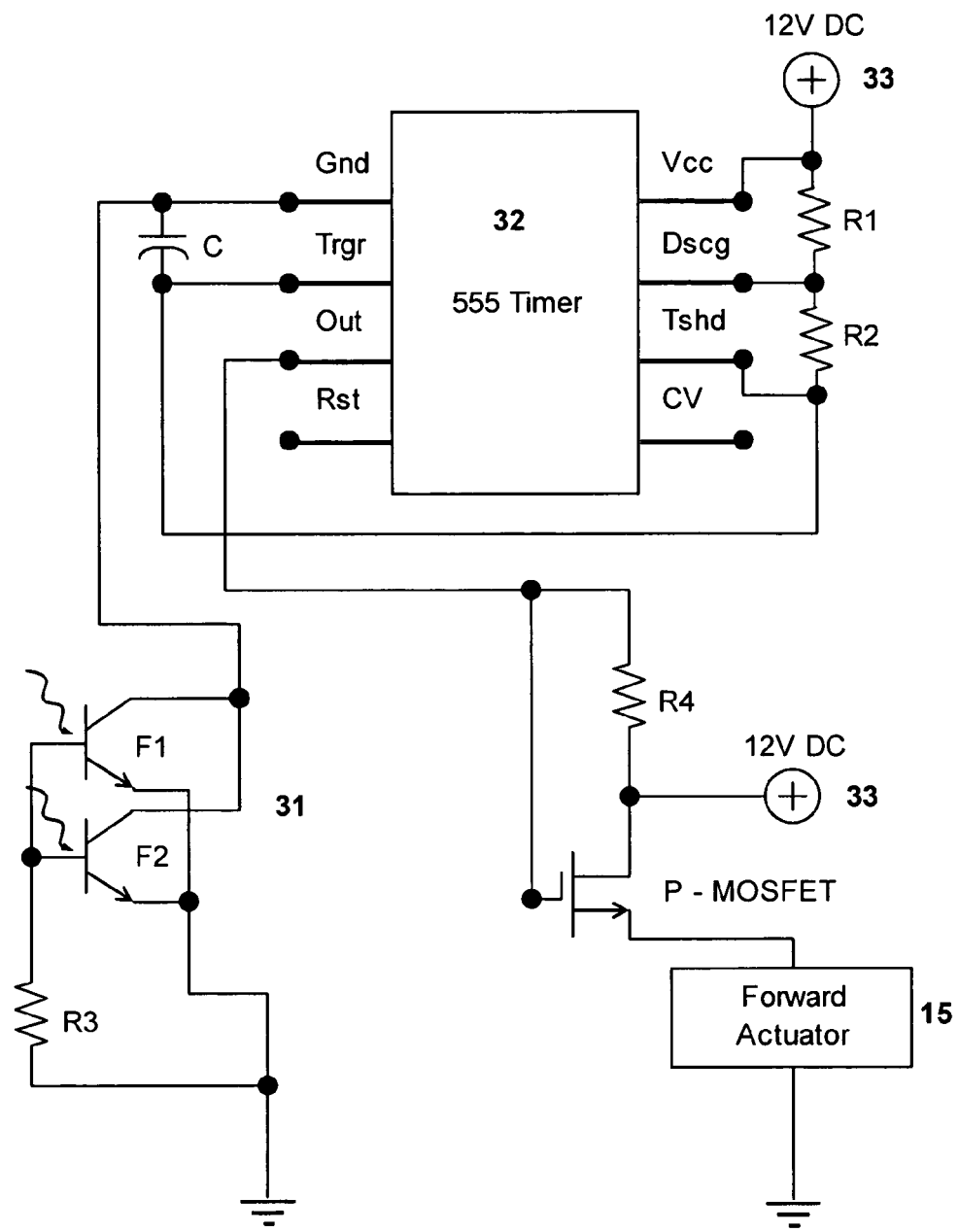
FIG. 7 is a schematic of the sensor circuit for controlling forward movement of the device.

The movement of the actuators is controlled through the use of an analog sensing circuit 30. Referring now to FIG. 7, in the primary embodiment, different phototransistors 31 are used to activate separate parts of the circuit in order to control the different directions of motion. A 555-timer 32 is provided to control another transistor, the P-MOSFET, that allows current to flow from the battery 33 to the actuation wires 15, 25.

When electric current is applied to the forward actuator 15, the actuator contracts to apply torque to the drive clutch 14. Accordingly, the drive clutch 14 is rotated in the "slip" direction by the forward actuator 15. The forward spring 17 torques the drive clutch 14 in the opposite direction (i.e., grip direction) as the forward actuator 15 cools. With each cycle of the forward actuator 15, the drive shaft 5 and worm 6 are rotated which results in the turning of the worm gear 7 and output shaft 4.

As the photovoltaic panel 2 is advanced throughout the day, the return spring 10 is slowly stretched, providing an opposing force to the forward motion while storing mechanical energy to be used later in the return motion. The torque from the return spring 10 on the output shaft 4 is in the opposite direction of the torque supplied by the worm drive 6. When the output shaft 4 (which holds the photovoltaic panel 2) is signaled to return to the start position, the worm 6 and worm gear 7 are separated so that the output shaft 4 is no longer locked in place. Once the output shaft 4 is free to swivel on the support bearings 8, the return spring 10 rotates the shaft 4 in the reverse direction until blocked by a mechanical stopper 11, resetting the photovoltaic panel 2 to the sunrise position. The drive platform 18 can pivot away to disengage the gears 6, 7 and then return for re-engagement. Under normal operation, this happens once per day. While engaged, the drive platform 18 is locked into place with a rigid locking arm 19. After the panel 2 has completed its rotation with the sun for the day, the unlocking is accomplished with a disengagement actuation wire 25 that contracts to pull on the locking arm 19, working against the pair of engagement springs 23 to remove the lock and pivot the drive platform 18 away from the worm gear 7 thereby disengaging the worm drive 6 and the worm gear 7. As the disengagement actuator 25 cools, the engagement springs 23 pull the locking arm 19 back into the locked position.

The ratio between the worm 6 and worm gear 7 may be specifically selected based upon the intended use of the motor, thereby allowing the assembly to be modified in order to maximize efficiency based upon particular operational conditions. With a low gear ratio, the forward actuator 15 must pull with more force, but over a smaller distance. With a higher ratio, the forward actuator 15 is given a mechanical advantage, and can take more precise (though more frequent) steps. This inverse balance between force and displacement can be fine-tuned by adjusting the leverage in a number of different places in the system. For example, the lengths of the pivoting drive platform 18 and locking arm 19 can be varied. Also, the diameters of the drive clutch 14 and output shaft 4 act as lever arms for the forward actuator 15 and return spring 10 respectively. Likewise, the forward actuator 15 might be shorter with a larger diameter to provide a larger force over a smaller distance, or it might be longer and thinner for a smaller force over a greater distance. With a higher gear ratio, the potential effects of backlash are reduced, thereby minimizing any wasted motion in each forward cycle. For example, with a given output angle per cycle, a higher gear 6, 7 ratio will require a greater angle of movement in the drive shaft 5. As the drive clutch 14 is rotated through a larger angle, a smaller portion of each cycle is lost to play. By using a worm 6 and worm gear 7, not only are high ratios easily achieved, but the output shaft 4 is also effectively locked in place from external forces on the photovoltaic panel 2 such as wind or vibration.

The use of a motor assembly with shape memory alloys reduces the size and cost of the drive mechanism. Specifically, the use of a nickel titanium alloy in the shape of a wire 15, 25 acts as a mechanical muscle, with one "contracting" stroke and one "stretching" stroke in each cycle. The contraction is accomplished when the actuator is heated above the threshold temperature. Heat can be applied to the wire in any number of ways, but in this device, an electric current is passed directly through the resistive actuator in order to raise its temperature. When the current stops, the actuator cools and stretches back to its original length under some opposing force. In a preferred embodiment, each stroke causes a displacement of 3 to 4% of the length of the wire, and the cycle can be reliably repeated millions of times. It will be noted that a greater displacement may be achieved by utilizing a SMA component in the shape of a spring but such an application would also serve to reduce the overall efficiency of the system.

The drive assembly was designed to operate such that the faster contraction stroke of the forward actuator 15 moves the drive clutch 14 in the slip direction, while the slower relaxing stroke moves the drive clutch 14 in the drive direction. Therefore, the forward spring 17 is providing the force that actually moves the photovoltaic panel 2 against the force of the return spring 10 (and any external forces such as wind), so the forward actuator 15 is working against the forward spring 17 alone. This provides two important benefits in the preferred embodiment. First, by utilizing the slower, cooling stroke to move the photovoltaic panel, dynamic effects of acceleration, momentum, and inertia are minimized. Specifically, upon crossing the temperature threshold, the actuator 15 contracts with a quick jerking-motion, whereas the cooling stroke is slow and controlled. Second, by isolating the contraction stroke against the return spring 10, the dynamic force profile of each stroke remains very consistent for the actuator 15, enhancing the reliability and lifespan of the actuator 15.

The simplest method of controlling the movement of the motor is through an analog sensing circuit 30. There must be at least one sensor for each direction of motion. In this design, different phototransistors 31 are used to turn on separate parts of the circuit 30 to control the different directions of motion. Multiple phototransistors can be used for each direction of motion by connecting them in parallel. The light-sensitivity of these phototransistors can be adjusted by changing the value of the resistor R3. Once a phototransistor activates the circuit, a 555-timer 32 controls another transistor that allows current to flow from a battery 33 to one of the actuation wires 15 or 25. The timer is used to convert a continuous "on" signal from the phototransistor to a cyclic "on-off" signal, allowing the actuator to heat and cool repeatedly. The necessary "on-time" and "off-time" are determined by the size of the actuation wire and power source, and can be adjusted to the correct duration by the values of two resistors R1, R2 and one capacitor C that are connected to the timer 32. Also, the timer 32 itself receives no power without a signal from one of the phototransistors 31 (because of a break in the ground line) in order to minimize overall power consumption. In the primary embodiment, the current is drawn from a battery 33 that has been charged by the photovoltaic panel 2, but it will be recognized that the power could also come from a photovoltaic panel directly, a bank of capacitors, an alternating current line, or any other electric power supply.

When the timer 32 is not grounded, it consumes no power, and the P-MOSFET breaks the circuit to the actuator 15 so that no movement can happen. If F1 or F2 (or both) receive light, then the timer 32 becomes grounded and begins to count (by charging and discharging the capacitor C through R1 and R2). Once the timer 32 has completed the first period of its two-step cycle, it toggles the output signal to close the P-MOSFET, allowing current to flow from the battery 33 (or photovoltaic panel, capacitor bank, AC, or any other power supply), through the P-MOSFET, then the actuator, to the ground. This heats the actuator, causing it to contract. When the timer has finished the second period of its cycle, the output of the timer is toggled once again, so the P-MOSFET breaks the circuit, allowing the actuator to cool and stretch. If the previous cycle did not rotate the output shaft 4 far enough, then the forward sensors will still be in the light, and the cycle continues until they are shaded. When all the sensors are shaded, the timer ground is broken so no further action is taken. The backward part of the circuit works exactly the same way. It is identical in form, but may have different values for C, R1, or R2 (for timing purposes), has physically different sensor positions and orientations, and a distinct actuator 25 which may differ in size from the forward actuator 15. It will be recognized by those in the art that other controller types, including digital circuits, may be used to accomplish the foregoing tasks.

The layout of the phototransistors 31 determines the way that the motor responds to the sun. The two phototransistors, F1, F2, mounted on the forward side of the shade 29a detect the sun if it is getting ahead of the plane of the photovoltaic panel 2. The other two sensors, B1, B2 are used on the backward side of the shade 29b to detect the sun if it is far behind the photovoltaic panel 2. This sensor mount 28 is oriented such that it moves with the photovoltaic panel 2 throughout the day. When the photovoltaic panel 2 is directly facing the sun, all phototransistors are shaded, so no motion is signaled (idle position). The width of the overhang structure 28a on the sensor mount 28 determines the range of the idle position. For example, if the panel 2 can be rotated in steps of four degrees then the overhang 28a should shade the forward sensors (F1, F2) until the sun is overhead by two degrees thereby minimizing tracking error.

Referring to FIGS. 5 and 6, under normal operation, the forward facing sensors (F1, F2) are triggered many times throughout the day, signaling the motor to inch along with the sun. Then at sunrise the next day, the backward facing sensors (B1, B2) will detect the rising sun and signal the motor to disengage the gears 6, 7, releasing the panel 2 to its starting position. When it is cloudy, no signal is given, and so no power is wasted trying to chase the sun when nothing but diffuse light is available in the sky (in which case the angle of the photovoltaic panel has little importance). If it is cloudy for only the beginning or end of the day, then the sun might re-appear at any point relative to the photovoltaic panel, so multiple sensors are used to cover greater angles. If the sun appears far ahead of the photovoltaic panel 2, then the motor will continue to cycle until the photovoltaic panel 2 is facing the sun, placing the forward facing sensors (F1, F2) in the shade of the sensor mount 28. If the sun appears behind the photovoltaic panel 2, then the panel will return to the starting position and catch up to the sun within a few minutes. Nevertheless, the return motion will still happen at most once per day.

Although the shape memory drive mechanism has thus far been described in relation to a solar tracking device, this device can be used as a modular step-motor for many applications outside of solar power. The shape memory alloy actuators are small, inexpensive, reliable, quiet, and efficient. The primary embodiment disclosed herein fits the solar power application because only the forward direction requires precision, while the return movement can be taken as a single leap. Also, multiple output revolutions are never needed.

However, if precise motion were required in both directions, the same principle could be used, but with a gear shifting, relying upon more than one worm gear assembly, rather than disengaging, allowing the same "forward drive" to work in the opposite direction as well. The sensing circuit 30 discussed in the photovoltaic application can be replaced with a programmable microprocessor. This inexpensive control can be very robust, and can work with a variety of inputs, such as programs or other sensors, to execute any number of different tasks. For increased speed, the drive shaft 5 can be fitted with multiple drive clutches, each with its own actuator/spring pair, working in a sequenced wave like pistons in a combustion engine. For increased strength, the forward actuator 15 size can be increased. Thicker actuators will pull with more force, and longer actuators will pull a greater distance. Therefore, longer actuators can be used for a greater angle of rotation in the drive shaft 5, or they can be mounted on a drive clutch with a larger diameter to turn the shaft 4 over the same angle, but with greater force. When using a worm 6 and worm gear 7 with a high gear ratio, extremely precise movements can be obtained, with steps of a fraction of a degree, packaged in a small modular case much like a traditional electromagnetic step motor. It will also be noted that the relative positions of the actuator(s) and spring(s) could be reversed allowing the motor to drive with the faster contracting stroke rather than as operated in the embodiments set forth thus far.

While the invention has been described in reference to certain preferred embodiments, it will be readily apparent to one of ordinary skill in the art that certain modifications or variations may be made to the system without departing from the scope of invention claimed below and described in the foregoing specification.

PARTS LIST

1. Solar Tracking Assembly (as a whole)
2. Photovoltaic Panel
3. Base Platform
4. Output Shaft
5. Drive Shaft
6. Worm Drive
7. Worm Gear
8. Support Bearings
9. Return Spring Cable
10. Return Spring
11. Output Shaft Stopper
12. Backlash Clutch
13. Backlash Clutch Bearing Block
14. Drive Clutch
14a. Drive Clutch Attachment Point of Forward Actuator
14b. Drive Clutch Attachment Point of Forward Spring
15. Forward Actuator
16. Forward Mounting Plate
17. Forward Spring
18. Drive Platform
19. Locking Arm
20. Platform Pivot Bracket
20a. Platform Pivot
21. Locking Arm Rollers
22. Locking Arm Pivot
23. Engagement Springs
24. Arm Stoppers
25. Disengagement Actuator
26. Disengagement Mounting Plate
27. Return Spring Pulley
28. Sensor Mount
28a. Sensor Mount Overhang
29a. Shade, with Forward Sensors
29b. Shade, with Backward Sensors
30. Analog Circuit
31. Phototransistors
32. 555 timer
33. Battery

We claim:

1. A solar tracking device comprising:

A stationary base;

A rotatable output shaft mounted on said stationary base, said shaft having a first end suitable for affixation of a solar receptor panel and a second end terminating in a worm gear;

A photovoltaic panel attached to said first end of said output shaft;

A drive platform having a locking arm assembly pivotably connected at a first end of said drive platform and a drive assembly secured at a second end; said drive assembly having a worm drive in mesh with said worm gear on said output shaft; said drive platform being further pivotably connected by a platform pivot to said stationary base; said drive assembly being disengageable from said worm gear through release of said locking arm;

An engagement mounting plate secured to said drive platform at a point proximate to the second end of said drive platform, the engagement mounting plate having a terminal suitable for the application of electric current;

A forward mounting plate secured to said drive platform at a point proximate to said first end of said drive platform, the forward mounting plate having a terminal suitable for the application of electric current;

A return spring secured to said stationary base at a first end and further attached to said output shaft at a second end;

A means to drive the drive assembly;

A means to pivotably disengage said drive assembly from said worm gear; and

A means to coordinate said means to drive the drive assembly and said means to pivotably disengage the worm gear as a function of the position of the sun;

Whereby the drive mechanism axially rotates said shaft around the long axis of said shaft based upon the position of the sun.

2. The device as in claim 1 wherein said means to drive the drive assembly comprises:

A drive shaft;

At least one drive clutch mounted on said drive shaft;

At least one backlash clutch mounted in said drive shaft;

At least one forward actuator wire secured at one end to said terminal of said drive assembly and attached to said drive clutch at the other end;

A forward spring secured at one end to said drive platform and attached at the other end to said drive clutch;

Whereby the drive clutch is first rotated in the slip direction by said forward actuator wire and then said forward spring torques the drive clutch in the drive direction thereby rotating the drive shaft which in turn rotates the worm gear.

3. A device as in claim 2 wherein said forward actuator wire is composed of a shape memory alloy.

4. The device as in claim 1 wherein said means to pivotably disengage said drive assembly from said worm gear comprises:

A disengagement actuator fixed at a first end to said locking arm and fixed at the second end to said engagement mounting plate;

At least one engagement spring secured to said fixed base at one end and secured to a point in said locking arm at the other end;

At least one arm roller affixed to said locking arm such that said arm roller is in rollable contact with said stationary base;

A plurality of arm stoppers affixed to said base in such locations so as to define the range of movement of said arm rollers;

Whereby a contraction of the disengagement actuator releases the locking arm permitting a force generated by said at least one engagement spring to pivot the entire drive platform around the platform pivot thus disengaging the worm drive from the worm gear.

5. A device as in claim 4 wherein said disengagement actuator is composed of a shape memory alloy.

6. A device as in claim 3 or 5 wherein said shape memory alloy is composed of a nickel-titanium alloy.

7. A device as in claim 1 wherein said means to coordinate said means to drive the drive assembly and said means to pivotably disengage the worm gear comprises:

A sensor mount incorporated into said output shaft;

A plurality of phototransistors secured to said sensor mount;

An analog circuit connected to said plurality of phototransistors;

A power source which supplies power to said means to drive the drive assembly and said means to pivotably disengage said drive assembly from said worm gear wherein said power source is controlled by said analog circuit.

8. A device as in claim 7 wherein said power source is said photovoltaic panel.

9. A device as in claim 7 wherein said power source is a battery.

* * * * *